United States Patent
Korczyc et al.

(10) Patent No.: US 11,949,381 B2
(45) Date of Patent: Apr. 2, 2024

(54) POWER SUPPLY AND METHOD OF OPERATING A POWER AMPLIFIER

(71) Applicant: ICEYE OY, Espoo (FI)

(72) Inventors: Jakub Korczyc, Espoo (FI); Sergei Ossif, Espoo (FI)

(73) Assignee: ICEYE OY, Espoo (FI)

( * ) Notice: Subject to any disclaimer, the term of this patent is extended or adjusted under 35 U.S.C. 154(b) by 435 days.

(21) Appl. No.: 17/293,812

(22) PCT Filed: Nov. 13, 2019

(86) PCT No.: PCT/EP2019/081194
§ 371 (c)(1),
(2) Date: May 13, 2021

(87) PCT Pub. No.: WO2020/099497
PCT Pub. Date: May 22, 2020

(65) Prior Publication Data
US 2022/0014150 A1    Jan. 13, 2022

(30) Foreign Application Priority Data
Nov. 14, 2018  (GB) ...................................... 1818592

(51) Int. Cl.
*H03F 1/30* (2006.01)
*H03F 1/02* (2006.01)
(Continued)

(52) U.S. Cl.
CPC ........... *H03F 1/0222* (2013.01); *H03F 3/195* (2013.01); *H03F 3/245* (2013.01); *H03F 3/72* (2013.01);
(Continued)

(58) Field of Classification Search
CPC .................................. H03F 1/30; H03F 3/217
(Continued)

(56) References Cited

U.S. PATENT DOCUMENTS 7,157,963 B1 * 1/2007 Booth ................... H03F 1/0227
330/297
8,253,470 B2 * 8/2012 Mulder ............... H03F 3/45192
327/306
(Continued)

FOREIGN PATENT DOCUMENTS

| WO | 2015124118 A2 | 8/2015 |
| WO | 2015124118 A3 | 8/2015 |

OTHER PUBLICATIONS

Search Report of the Great Britain Patent Office from Appl'n No. 1818592.6 dated Apr. 23, 2021.
(Continued)

*Primary Examiner* — Henry Choe
(74) *Attorney, Agent, or Firm* — DENTONS US LLP

(57) ABSTRACT

A method of operating a power amplifier supplying power to an antenna, supplying switched power to the power amplifier comprises in a first mode of operation via a driver circuit and one or more switches to switch the supply of power to the power amplifier on and off periodically; and calibrating the power amplifier in a second mode of operation. The calibrating comprises supplying voltage to the power amplifier via the same driver circuit and one or more switches for a calibration pulse duration longer than the on/off period. A power supply and an RF front end comprising the power supply are also disclosed.

14 Claims, 5 Drawing Sheets

(51) Int. Cl.
  *H03F 3/195*   (2006.01)
  *H03F 3/24*   (2006.01)
  *H03F 3/72*   (2006.01)

(52) U.S. Cl.
  CPC .................. *H03F 2200/451* (2013.01); *H03F 2203/7227* (2013.01)

(58) Field of Classification Search
  USPC ............................... 330/297, 251, 207 A, 10
  See application file for complete search history.

(56) References Cited

U.S. PATENT DOCUMENTS

| | | | |
|---|---|---|---|
| 8,698,558 B2 * | 4/2014 | Mathe | H03F 1/0227 330/297 |
| 2009/0002074 A1 * | 1/2009 | Kushida | H03F 3/217 330/297 |
| 2012/0032722 A1 * | 2/2012 | Mulder | H03F 3/45928 327/307 |
| 2013/0231069 A1 | 9/2013 | Drogi | |
| 2014/0073272 A1 | 3/2014 | Asensio et al. | |
| 2017/0187444 A1 * | 6/2017 | Murakami | H04W 52/42 |
| 2017/0277108 A1 | 9/2017 | Masaki | |
| 2018/0295442 A1 * | 10/2018 | Das | H03F 3/211 |

OTHER PUBLICATIONS

Intention to Grant of United Kingdom Patent Office in Appl'n No. GB1818592.6, dated Sep. 14, 2021.

* cited by examiner

POWER SUPPLY AND METHOD OF OPERATING A POWER AMPLIFIER

This application is the National Stage filing under 35 U.S.C. 371 of International Application No. PCT/EP2019/081194 filed on Nov. 13, 2019, which claims priority to GB Application No. 1818592.6 filed on Nov. 14, 2018, the contents of which are hereby incorporated by reference herein in their entirety.

The present invention relates to power supplies and methods of operating power amplifiers.

BACKGROUND

Power amplifiers are used in a variety of applications to amplify signals delivered to electronic components or to amplify power delivered to various electrical and electronic components. Such components may include but are not limited to antennas such as those used in satellite communications. Amplifiers supplying antennas often operate in a "switched" mode in rather than operating continuously. For example an amplifier might be dedicated to one of transmitting and receiving modes and may therefore be switched off during the other mode. Power amplifiers may be set up to operate according to particular parameters, for example to ensure optimum performance. These operating parameters may include, but are not limited to, operating voltage, or gate voltage, drain voltage and others. In some operating environments, pre-set operating parameters may drift over time and with variations in temperature so that the performance of the amplifier becomes sub-optimum. In some applications this needs to be corrected from time to time in a calibration process, particularly the operating voltage. The calibration of an amplifier may require the application of power to the amplifier. The power requirements for calibration of an amplifier may be different from the power requirements for normal operation of the amplifier. Therefore in order to fulfil the different power requirements the amplifier may be removed from its normal operating environment to a test or calibration environment, or separate power supply components may be provided for the supply of power to calibrate an amplifier.

SUMMARY

This summary is provided to introduce a selection of concepts in a simplified form that are further described below in the Detailed Description. This summary is not intended to identify key features or essential features of the claimed subject matter, nor is it intended to be used to determine the scope of the claimed subject matter.

Some embodiments of the invention provide a power supply and a method of operating a power amplifier in which the same driver circuit and switches are used to supply power to the amplifier both in normal operation and during calibration. This is particularly useful where the amplifier is required to switch on and off periodically, for example in connection with an antenna that switches between transmit and receive modes. A power supply and method according to some embodiments of the invention may be achieved through choice of components that can supply switched power to turn the power on and off periodically and can also supply voltage to the power amplifier for a calibration pulse duration that is longer than the on/off period.

BRIEF DESCRIPTION OF THE DRAWINGS

Some embodiments of the invention will be described, by way of example, with reference to the following drawings, in which.

DETAILED DESCRIPTION

Embodiments of the present invention are described below by way of example only. Various embodiments of the invention are described with various features. The features may be combined as appropriate, as would be apparent to a skilled person, and may be combined with any of the aspects of the invention.

Some embodiments of the invention provide a method of operating a power amplifier supplying power to an antenna. Antennas are used in a variety of situations including satellite communication. An example situation is described with reference to FIG. 1 for a method and apparatus, according to some embodiments of the invention, on a satellite. The same principles of construction and operation used in this example are applicable in other power supply and power amplification applications and situations.

Figure 1:
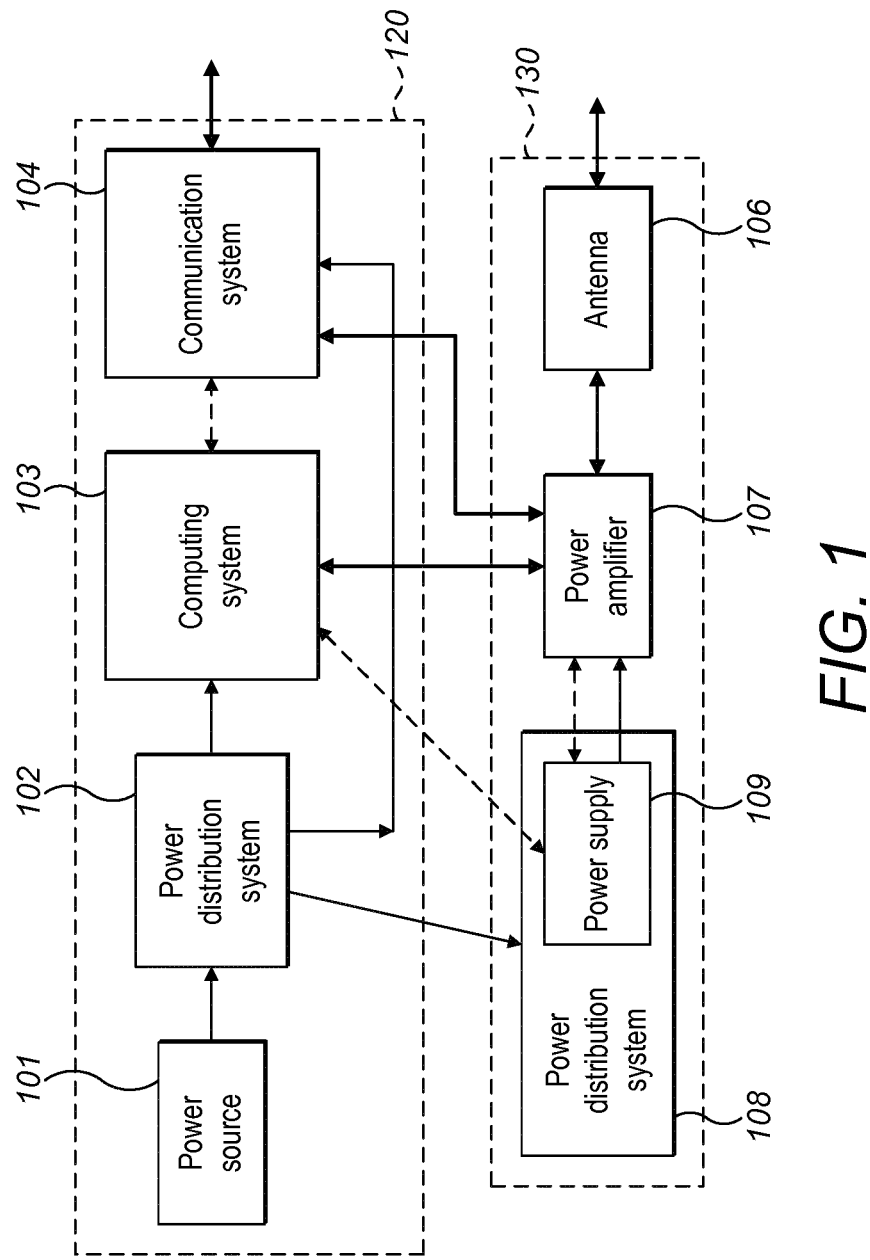
FIG. 1 is a schematic block diagram illustrating components of a satellite including a power amplifier according to some embodiments of the invention.

FIG. 1 is a schematic diagram illustrating components of a satellite including one or more power amplifiers according to some embodiments of the invention. One-directional solid arrows between components are used to indicate power connections, two-directional solid arrows are used to indicate RF signal connections, and dotted lines are used to indicate data connections. In practice, some components shown in FIG. 1 are located at a satellite body, indicated by rectangle 120, and some are located at a structure extending from the body, sometimes called a "wing", indicated by rectangle 130. The components shown in FIG. 1 include a power source 101 and a power distribution system 102. The power source 101 and power distribution system 102 supply power to a computing system 103 and a communication system 104 which may communicate with earth stations or other satellites as is known in the art. The power source 101, power distribution system 102, computing system 103 and communication system 104 are collectively referred to in the art as the satellite "bus".

The term 'computing system' is used herein to refer to any device or group of devices with processing capability such that it/they can execute instructions. Those skilled in the art will realise that such processing capabilities may be incorporated into many different devices and therefore the term 'computing system' as used herein may include personal computers, servers, mobile communication devices and many other devices.

The satellite may include one or more RF antennas, for example radar antennas, which may be located at one or more wings 130. Each antenna or antenna array 106 may have an associated power amplifier 107, supplied with power via a power distribution system 108 from power source 101, for example via power distribution system 102.

Both power distribution systems 102 and 108 may comprise control logic. The combination of the power distribution system 108, power amplifier 107 and antenna 106 comprise what is termed in the art an RF "front end".

The power distribution system 108, supplying power to power amplifier 107, may comprise one or more power supplies according to some embodiments of the invention. One is indicated by reference numeral 109.

The power supply 109 shown in FIG. 1 has a two way data communication link with the computing system 103, and may be configured to send data to the computing system 103 such as current measurements. The computing system 103 may send data to the power supply 109, such as operating instructions, voltage levels requests for data and other signals as will be familiar to those skilled in the art.

A power amplifier usually amplifies signals that are output to an antenna for transmission. A separate amplifier, not shown, usually referred to as a "low noise amplifier" or LNA may be provided to amplify the power levels of received signals from antenna 106.

Common reference numerals are used throughout the figures to indicate similar features. It should be noted that such features are not particular to satellites or satellite operation and may be generic to power amplification in general unless otherwise stated.

Figure 2:
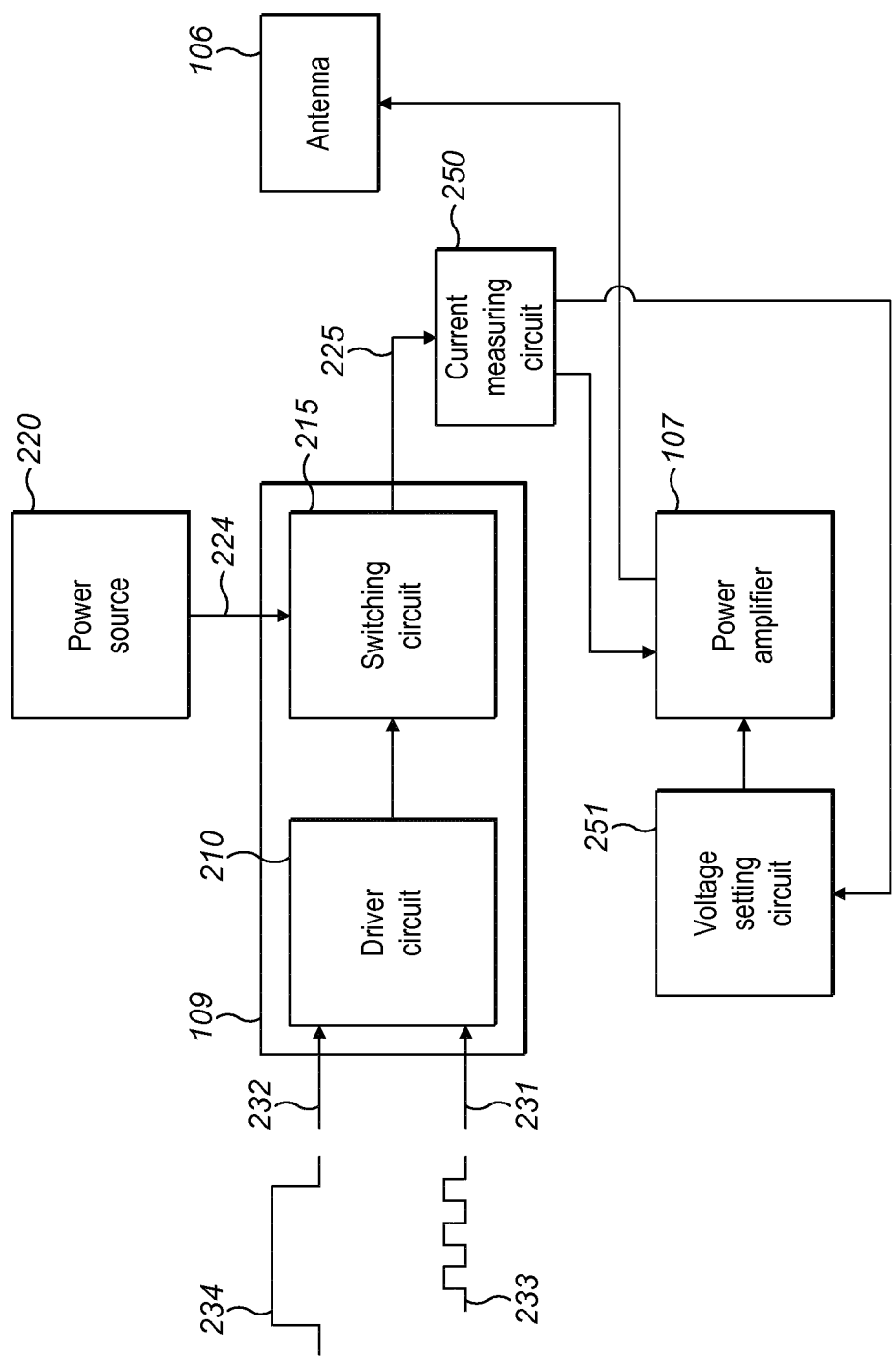
FIG. 2 is a schematic block diagram illustrating a power supply according to some embodiments of the invention, arranged to supply power from a power source to an amplifier.

FIG. 2 is a schematic block diagram illustrating a power supply 109 according to some embodiments of the invention, arranged to supply power from a power source 220 (for example via a power distribution system, not shown in FIG. 2) to a power amplifier 107. Power supply 109 comprises a driver circuit 210, one or more switches, shown in this example as a switching circuit 215, a power input 224 and a power output 225. The driver circuit 210 is arranged to control the switching circuit 215 to supply switched power, applied to the power input 224 from power source 220, to the output 225. The driver circuit has two inputs 231, 232, arranged to receive respective switching signals 233, 234. The signals 231, 232 are not shown to scale but it can be seen that the second switching signal 234 comprises a pulse of longer duration than the period of the first switching signal 233.

In a first mode of operation the driver circuit 210 receives the first switching signal 233 and uses this to control the switching circuit 215 to switch power from the power source 220 to the output 225 on and off periodically. In this way switched power may be supplied to the power amplifier 107 connected to the antenna 106. An amplifier connected to an antenna may amplify signals for transmission by the antenna, or amplify signals received via the antenna. Where the amplifier is arranged to perform one of these functions, the power supply to the amplifier may be switched off when the antenna is transmitting or receiving as appropriate, for example periodically, using a power supply according to some embodiments of this invention.

In a second mode of operation the driver circuit 210 receives the second switching signal 234 and uses this to control the switching circuit to supply power to the output 225 for the duration of the pulse comprised in the second switching signal 234, which is longer than the period of the switching signal 233. The second mode of operation may be used to calibrate the amplifier 107, for example to determine or adjust an operating or set point voltage of the amplifier 107, for example a gate voltage, in a manner known in the art. In order to set or adjust the operating voltage, voltage from power supply 220 may be supplied to the amplifier for the duration of the pulse in signal 234 via switching circuit 215. The calibration may comprise measuring a current flowing to amplifier 107 using a current measuring circuit and setting or adjusting the amplifier operating voltage based on the current measurement. For this purpose a current measuring circuit 250 is interposed between the switching circuit 215 and the power amplifier 107. The output of the current measuring circuit 250 is fed back to a voltage setting circuit 251. The current measuring circuit 250 and the voltage setting circuit 251 may comprise logic components as is known in the art of amplifier calibration. Thus in the embodiment of FIG. 2, the same driver circuit 210 and switching circuit 215 are used to supply periodic switched power to the amplifier 107 during a first, or "normal" mode of operation and to supply voltage to the amplifier 107 during a second or calibration mode of operation.

The power supply 109 of FIG. 2 may be constructed in various ways and may include components in addition to the driver circuit 210 and the switching circuit 215. One way of constructing the power supply 109 will now be described in more detail with reference to FIGS. 3 and 4. Other ways of constructing the power supply 109 will become apparent to the person skilled in the art.

Figure 3:
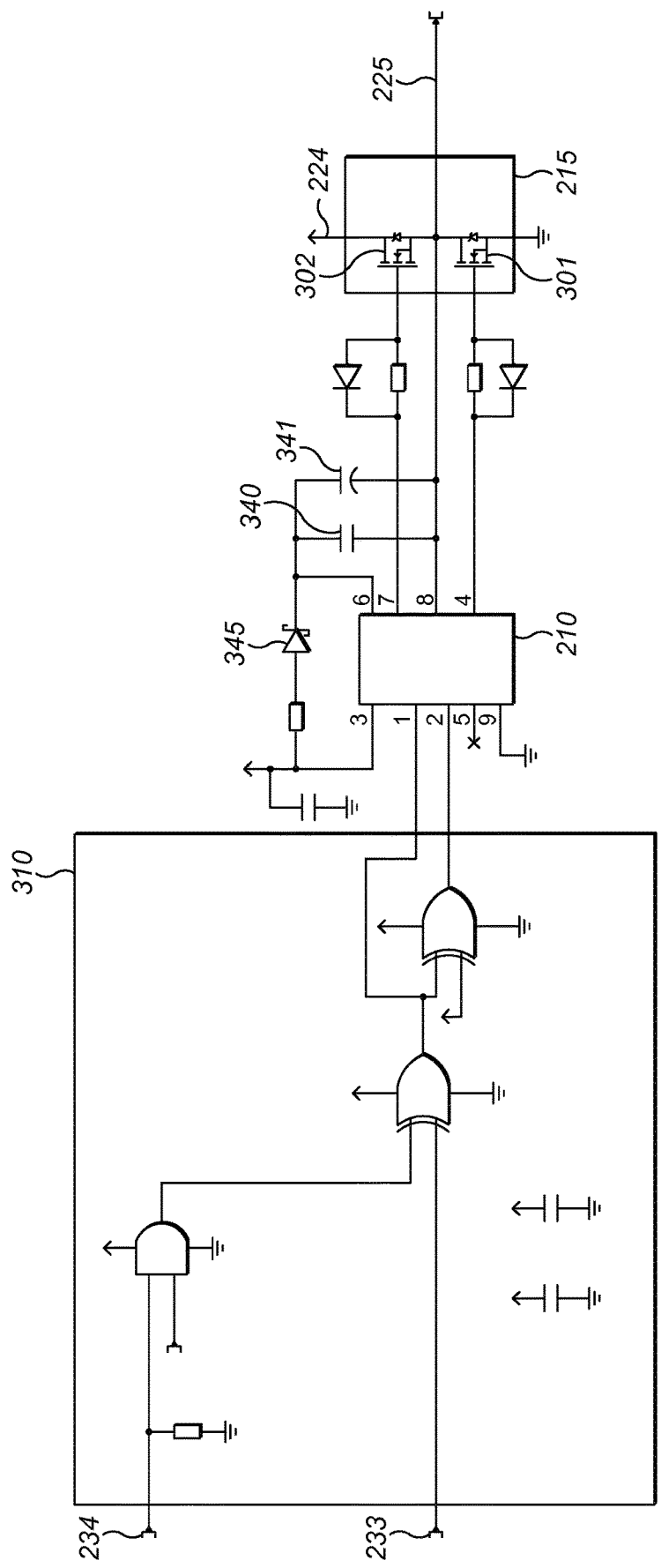
FIG. 3 is a diagram showing components of the power supply of FIG. 2 according to some embodiments of the invention.

FIG. 3 is a diagram showing in more detail components that may be included in the power supply 109 according to some embodiments of the invention. In FIG. 3, the switching circuit 215 comprises two switches 301, 302, arranged in series between the power input 224 and ground. The output 225 is taken between the switches. The switches 301, 302 may each comprise a transistor. The driver circuit 210 may comprise an integrated driver circuit of a kind known in the art, one example of which is described in more detail with reference to FIG. 4. According to some embodiments of the invention, the transistors 301, 302 may comprise MOSFETs and the driver circuit 210 may comprise a MOSFET driver circuit as known in the art. An example of a suitable MOSFET driver circuit is the LTC4444-5 available from Linear Technology Corporation. Other suitable driver circuits will be known to those skilled in the art.

The use of MOSFET switches and associated driver circuits is known in the art of mobile communications. Such components are commonly used in smart phones for example, but for totally different functions, for example to provide power for logic circuitry, and not in connection with power amplification.

Switches 301, 302 are referred to herein as "low side" and "high side" respectively, the term "high side" referring to the higher voltage connection as is known in the art.

FIG. 3 also shows input control logic 310 arranged to apply the input signals 233, 234 to the appropriate inputs of the driver circuit 210 to enable the driver circuit 210 to provide appropriate output signals to the switching circuit 215. The switches may be controlled such that when switch 301 is open, switch 302 is closed and the power supply is switched "off" to the amplifier 107. When switch 301 is closed, switch 302 is open so that the power supply is switched "on" to the amplifier 107 and power from the source 220 may be supplied to the amplifier 107. Switches 301 and 302 may therefore require separate switching signals, for example when they comprise transistors.

In the case of a transistor, such as a MOSFET, the switching signal may comprise a voltage applied to the gate terminal to hold the gain voltage above the source voltage to open a conducting path between the drain and source terminals. A capacitor is commonly used to supply a voltage to switch on the high side switch 302, for example to maintain the gate voltage at the high side transistor above the voltage at the source and therefore open the switch 302. This is commonly referred to as "bootstrapping" and the capacitor is commonly referred to as a "bootstrap" capacitor.

The first switching signal 233 may comprise a periodic square wave applied to the control logic 310 which applies the same square wave and an inverse square wave to respective inputs of the driver circuit 210 which outputs a square wave voltage and its inverse, with larger voltage difference, from respective output terminals to the gates of the switches 301 and 302. The term "square wave" is used herein to refer to a periodic two-state signal. The two states may have different durations within each period. For example, where the states correspond to transmit and receive modes of an antenna, the transmit mode may occupy less time than the transmit mode, for example the antenna may be in receive mode for more than twice as long as in transmit mode. In other words an antenna may be "listening" more than "talking".

As noted elsewhere herein, according to some embodiments of the present invention, the same driver and switching circuit may be used to switch power to the amplifier 107 during normal operation and during calibration. This may be achieved by maintaining the high side switch 302 open for a longer duration than during normal operation, during which a calibration operation may be carried out, for example by the second switching signal comprising a pulse of longer duration than the period of the first switching signal. A bootstrap capacitor as commonly used in the art may not be sufficient for this purpose since the accumulated voltage may decay during the longer duration, with the result that the high side switch is not kept open for sufficiently long. Therefore according to some embodiments of this invention, additional bootstrap capacitance is used in order to maintain a voltage at the high side switch for the longer duration.

An example of such an arrangement is shown in FIG. 3 where two bootstrap capacitors 340, 341 are connected between the output 225 and a boost input of the driver circuit 210 which is then applied to the gate of switch 302. A diode 345 prevents the charge accumulated at the bootstrap capacitors discharging to ground.

The second switching signal 234 may comprise a square wave which is inversed and transformed in the same way as the first switching signal 233 and applied to the gates of the first and second switches 301, 302.

Depending on the intended use of the amplifier 107, the frequency of the first switching signal 233 may be in the kHz range, for example around 5 kHz. The frequency of the second switching signal 234 may be several orders of magnitude lower, for example once per day or once per week. The second input signal may comprise a series of pulses, e.g. finite, optionally all of the same length, each having a duration longer than the period of the first input signal. The number of pulses may be predetermined and/or may be equally spaced. Alternatively the number and/or spacing of the pulses may be determined in real time, for example by logic in the current measuring circuit 250, for example depending on whether additional measurements are required in order to set or adjust the operating voltage. Calibration of an amplifier according to some embodiments of the invention may take place periodically or it may be initiated on demand, for example in response to a signal received via the computing system 103 in the embodiment of FIG. 1. The duration of the pulse in the second switching signal may be a few orders of magnitude higher than the period of the first switching signal, for example 100 to 1,000 times longer. For example the period of the first switching signal may be 1 µs and the duration of the pulse in the second switching signal may be 0.1-1 second.

In a typical arrangement of a driver circuit in a mobile phone, the capacitance of the bootstrap capacitor may be around 100 nF. In order to increase the switch on time of the high side switch 302 to enable calibration, the capacitance may be increased to e.g. 100 µF. The capacitance will depend on the time required for calibrating the amplifier, which may include time for it to warm up if it was not previously operating, and may vary from one amplifier to another. The capacitance may be limited by the period of the periodic switching signal since if it is too large it may not have accumulated sufficient charge during the period to switch on the high side transistor during normal operation.

Figure 4:
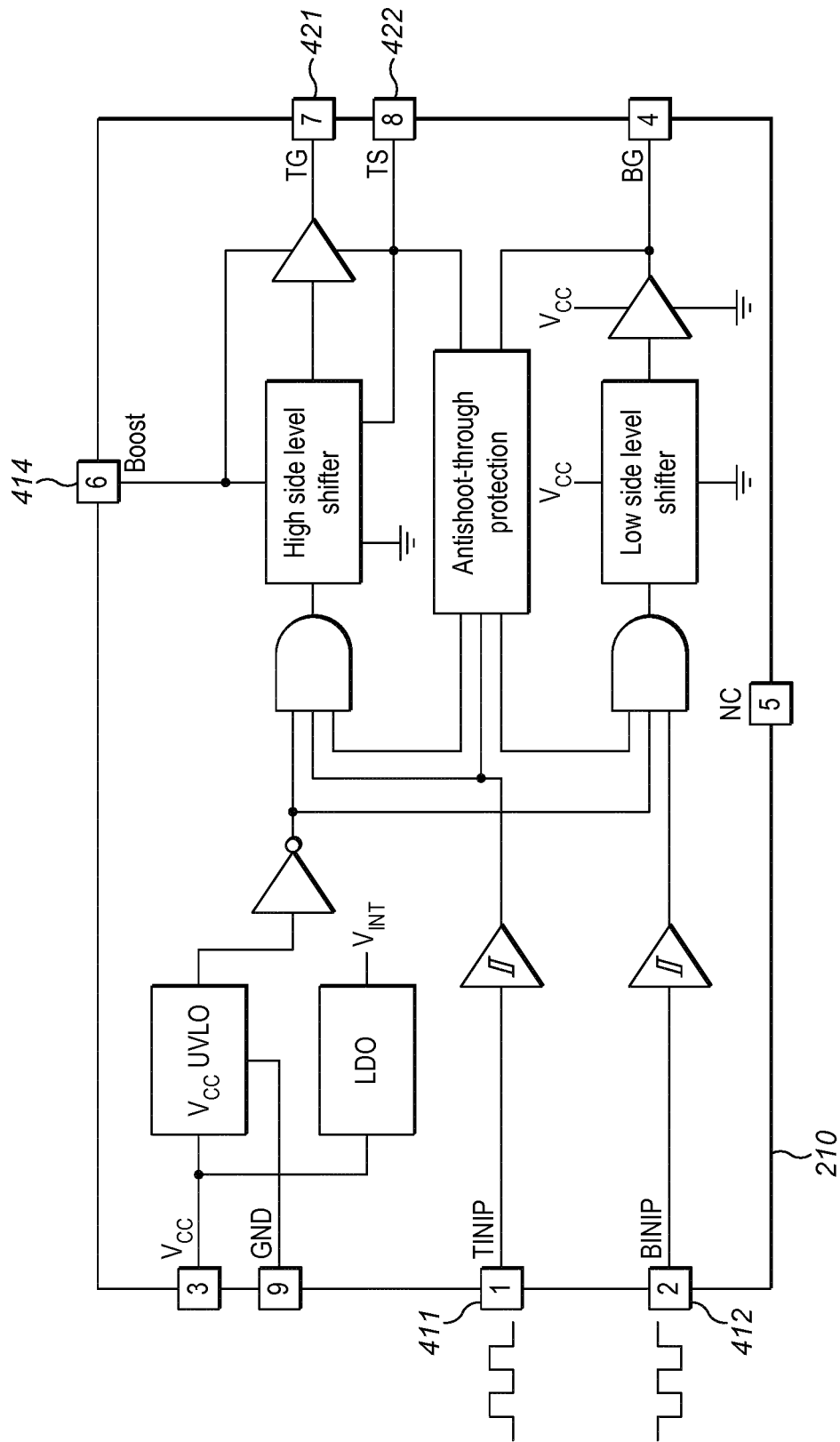
FIG. 4 is a diagram showing components of a driver circuit according to some embodiments of the invention.

FIG. 4 is a diagram showing components of a driver circuit according to some embodiments of the invention. As noted in connection with FIG. 3, control logic 310 applies an input square wave and an inverse of the input square wave (derived from either of the signals 233, 234) to respective input terminals of the drive circuit 210, shown in FIG. 4 as 411 and 412. The driver circuit 210 outputs a square wave voltage and its inverse, with larger voltage difference, from respective output terminals 421 and 422 to the gates of the switches 301 and 302 respectively. The voltage of the signal at terminal 421 is boosted by the voltage at the capacitors 340 and 341 in FIG. 3 applied to a boost terminal 414 of the driver circuit 210 and then to the output terminal 421.

Figure 5:
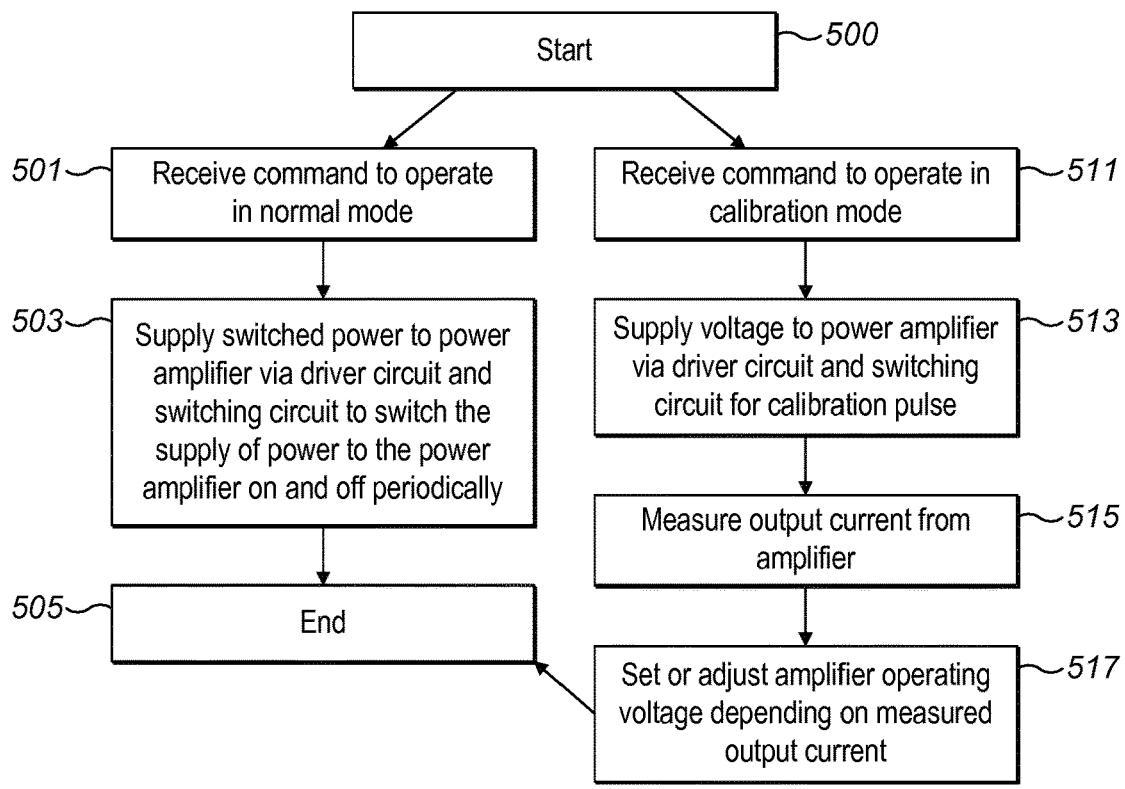
FIG. 5 is a flowchart illustrating a method according to some embodiments of the invention.

FIG. 5 is a flow chart illustrating a method of operating an amplifier according to some embodiments of the invention. After initialisation of components at operation 500, for example the components shown in FIG. 3, a command 501 or 511 may be received by the power distribution system 108, for example from computing system 103, either to operate in normal mode (FIG. 5 operation 501) or in calibration mode (operation 511). In normal mode at operation 503 switched power is supplied to a power amplifier via driver circuit 210 and one or more switches, for example in switching circuit 215, to switch the power to the power amplifier on and off periodically. In calibration mode at operation 513 voltage is supplied to the power amplifier via the same driver circuit and switch(es) for the duration of the calibration pulse. During the calibration pulse an output current is measured from the power amplifier at operation 515 and depending on the measured current the operating voltage of the power amplifier may be set or adjusted at operation 517. Either of the operation modes may end at operation 505.

Figure 6:
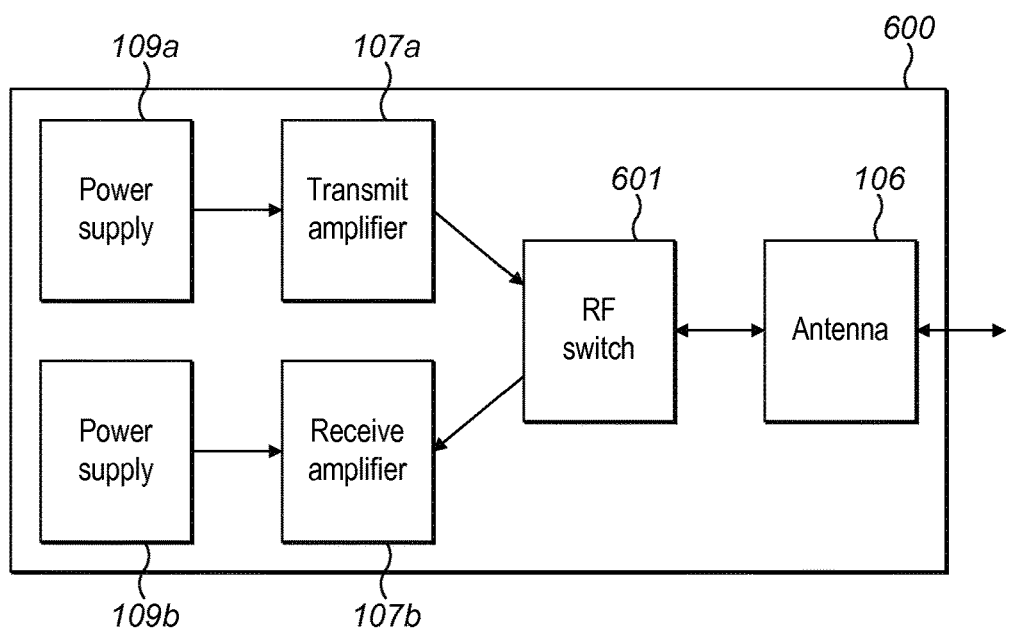
FIG. 6 is a block diagram of an RF front end according to some embodiments of the invention.

Some embodiments of the invention may comprise an RF front end, which may for example be provided as a module for inclusion in apparatus such as a satellite. The RF front end may comprise an antenna, a power amplifier supplying power to the antenna, and a power supply supplying power to the power amplifier. The amplifier may be dedicated to transmitted or received signals. The antenna may transmit and receive signals. Thus an RF front end may comprise at least one transmit amplifier and at least one receive amplifier supplied by respective power supplies. An example of an RF front end 600 is shown in FIG. 6 comprising an antenna 106 connected by an RF switch 601 and respective transmit and receive amplifiers 107a and 107b served by respective power supplies 109a and 109b. The transmit and receive amplifiers may for example receive signals from and transmit signals to a computing system, for example a computing system on a satellite bus as shown in FIG. 1.

The components described herein are not necessarily physically separated from each other unless otherwise stated, and the functionality of components illustrated in the figures may be distributed or shared between different or the same physical devices. For example, some of the functions of a communication system may be performed by a computing system and vice versa.

It will be understood that the benefits and advantages described above may relate to one embodiment or may relate to several embodiments. The embodiments are not limited to those that solve any or all of the stated problems or those that have any or all of the stated benefits and advantages.

Any reference to 'an' item refers to one or more of those items. The term 'comprising' is used herein to mean including the method steps or elements identified, but that such steps or elements do not comprise an exclusive list and a method or apparatus may contain additional steps or elements.

As used herein, the terms "component" and "system" may encompass computer-readable data storage that is configured with computer-executable instructions that cause certain functionality to be performed when executed by a processor. The computer-executable instructions may include a routine, a function, or the like. It is also to be understood that a component or system may be localized on a single device or distributed across several devices.

Further, as used herein, the term "exemplary" is intended to mean "serving as an illustration or example of something".

Further, to the extent that the term "includes" is used in either the detailed description or the claims, such term is intended to be inclusive in a manner similar to the term "comprising" as "comprising" is interpreted when employed as a transitional word in a claim.

The figures illustrate exemplary methods. While the methods are shown and described as being a series of acts that are performed in a particular sequence, it is to be understood and appreciated that the methods are not limited by the order of the sequence. For example, some acts can occur in a different order than what is described herein. In addition, an act can occur concurrently with another act. Further, in some instances, not all acts may be required to implement a method described herein.

The order of the steps of the methods described herein is exemplary, but the steps may be carried out in any suitable order, or simultaneously where appropriate. Additionally, steps may be added or substituted in, or individual steps may be deleted from any of the methods without departing from the scope of the subject matter described herein. Aspects of any of the examples described above may be combined with aspects of any of the other examples described to form further examples without losing the effect sought.

It will be understood that the above description of a embodiments is given by way of example only and that various modifications may be made by those skilled in the art. What has been described above includes examples of one or more embodiments. It is, of course, not possible to describe every conceivable modification and alteration of the above devices or methods for purposes of describing the aforementioned aspects, but one of ordinary skill in the art can recognize that many further modifications and permutations of various aspects are possible. Accordingly, the described aspects are intended to embrace all such alterations, modifications, and variations that fall within the scope of the appended claims.

The invention claimed is:

1. A method of operating a power amplifier supplying power to an antenna, the method comprising:
   in a first mode of operation, supplying switched power to the power amplifier via a driver circuit and one or more switches to switch the supply of power to the power amplifier on and off under the control of a periodic first switching signal; and
   in a second mode of operation calibrating the power amplifier, wherein the calibrating comprises supplying voltage to the power amplifier via the same driver circuit and one or more switches under the control of a second switching signal comprising a pulse with a duration longer than the period of the first switching signal,
   wherein,
     the antenna is a radio frequency "RF" antenna forming part of an RF front end operable in receive and transmit modes,
     the power amplifier operates during one of the receive and transmit modes, and
     the periodic switching on and off of the power amplifier is timed to switch off the power amplifier during the other of the receive and transmit modes.

2. A method of operating a power amplifier supplying power to an antenna, the method comprising:
   in a first mode of operation, supplying switched power to the power amplifier via a driver circuit and one or more switches to switch the supply of power to the power amplifier on and off under the control of a first periodic switching signal; and
   in a second mode of operation, calibrating the power amplifier, wherein the calibrating comprises supplying voltage to the power amplifier via the same driver circuit and one or more switches under the control of a second switching signal comprising a pulse with a duration longer than the period of the first periodic switching signal,
   wherein:
     the one or more switches comprise a pair of switches arranged one each side of a power output to the amplifier between a power source and ground,
     a capacitor is used to switch on the high side transistor, and
     the capacitance of the capacitor is sufficient to keep the high side transistor switched on for the calibration pulse duration.

3. The method of claim 1 wherein the duration of the calibration pulse is 100-1,000 times longer than a switching period in the first mode of operation.

4. A method of operating a power amplifier supplying power to an antenna, the method comprising:
   in a first mode of operation, supplying switched power to the power amplifier via a driver circuit and one or more switches to switch the supply of power to the power amplifier on and off under the control of a first periodic switching signal; and
   in a second mode of operation, calibrating the power amplifier, wherein the calibrating comprises supplying voltage to the power amplifier via the same driver circuit and one or more switches under the control of a second switching signal comprising a pulse with a duration longer than the period of the first periodic switching signal,
   wherein the calibrating comprises measuring a current flowing from the power source to the power amplifier during the calibration pulse duration.

5. The method of claim 4 wherein the calibrating comprises repeating the supplying of voltage and measuring of power amplifier output current with a different voltage during subsequent calibration pulse durations and setting or adjusting an operating voltage of the power amplifier dependent on the current measurements.

6. The method of claim 1 comprising supplying to the driver circuit a first periodic switching signal in the first mode of operation and a second switching signal in the second mode of operation, wherein the second switching signal comprises the calibration pulse.

7. The method of claim 6 wherein the second switching signal comprises a series of pulses each having a duration longer than the period of the first input signal.

8. The method of claim 7 comprising determining the number and spacing of the pulses in the series of pulses in real time.

9. The method of claim 1 comprising initiating the second mode of operation in response to a received signal.

10. A power supply comprising one or more switches and a driver circuit arranged to control the one or more switches to supply switched power from a power source to an output of the power supply,
one or more inputs to the driver circuit arranged to receive a first periodic switching signal in a first mode of operation and a second switching signal in a second mode of operation, the second switching signal comprising a pulse of a duration longer than the period of the first switching signal,
wherein the driver circuit is arranged to use the first and second switching signals to:
in the first mode of operation, control the one or more switches to switch the supply of power to the output on and off periodically; and
in the second mode of operation control the one or more switches to supply power to the output for the duration longer than the period of the first switching signal.

11. The power supply of claim 10, wherein the switches comprise a pair of switches arranged in series between a power input and ground, and the power supply comprises an output between the switches and a capacitor arranged to supply a voltage to switch on the switch on the power supply side of the output in both first and second modes of operation.

12. The power supply of claim 10 wherein each of the one or more switches comprises a transistor.

13. The power supply of claim 12 wherein each of the one or more switches comprises a MOSFET.

14. An RF front end comprising one or more antennas and one or more amplifiers arranged to amplify signals received by or to be transmitted from the one or more antennas, and one or more power supplies arranged to supply power to each of the one or more amplifiers wherein each power supply comprises:
one or more switches and a driver circuit arranged to control the one or more switches to supply switched power from a power source to an output of the power supply,
one or more inputs to the driver circuit arranged to receive a first periodic switching signal in a first mode of operation and a second switching signal in a second mode of operation, the second switching signal comprising a pulse of a duration longer than the period of the first switching signal,
wherein the driver circuit is arranged to use the first and second switching signals to:
in the first mode of operation control the one or more switches to switch the supply of power to the output on and off periodically; and
in the second mode of operation control the one or more switches to supply power to the output for the duration longer than the period of the first switching signal.

\* \* \* \* \*